US012580110B2

(12) United States Patent
Hayashi et al.

(10) Patent No.: US 12,580,110 B2
(45) Date of Patent: Mar. 17, 2026

(54) SUPERCONDUCTING COIL, SUPERCONDUCTING DEVICE, AND LIQUID EPOXY RESIN COMPOSITION

(71) Applicant: KABUSHIKI KAISHA TOSHIBA, Tokyo (JP)

(72) Inventors: Mariko Hayashi, Shinagawa (JP); Yumiko Sekiguchi, Kawasaki (JP); Tomoko Eguchi, Yokohama (JP); Keiko Fujii, Chiba (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 793 days.

(21) Appl. No.: 17/929,049

(22) Filed: Sep. 1, 2022

(65) Prior Publication Data

US 2023/0298791 A1 Sep. 21, 2023

(30) Foreign Application Priority Data

Mar. 17, 2022 (JP) ................................. 2022-042166

(51) Int. Cl.
| | |
|---|---|
| *H01F 6/06* | (2006.01) |
| *H01F 41/04* | (2006.01) |
| *H01F 41/12* | (2006.01) |
| *H10N 60/85* | (2023.01) |

(52) U.S. Cl.
CPC ............. *H01F 6/06* (2013.01); *H01F 41/048* (2013.01); *H01F 41/127* (2013.01); *H10N 60/85* (2023.02)

(58) Field of Classification Search
CPC ........................................................ H01F 6/06
See application file for complete search history.

(56) References Cited

U.S. PATENT DOCUMENTS

| | | | | |
|---|---|---|---|---|
| 2008/0055026 A1* | 3/2008 | Frank | ........................ | H01F 6/06 |
| | | | | 335/216 |
| 2021/0296034 A1 | 9/2021 | Hayashi et al. | | |

FOREIGN PATENT DOCUMENTS

| | | |
|---|---|---|
| JP | 5-311047 A | 11/1993 |
| JP | 3272770 B2 | 4/2002 |
| JP | 4010420 B2 | 11/2007 |
| JP | 4428618 B2 | 3/2010 |
| JP | 5415334 B2 | 2/2014 |
| JP | 2014-111693 A | 6/2014 |
| JP | 2020-45501 A | 3/2020 |
| JP | 2020-47739 A | 3/2020 |
| JP | 6672630 B2 | 3/2020 |
| JP | 2021-28389 A | 2/2021 |

(Continued)

*Primary Examiner* — Paul A Wartalowicz
(74) *Attorney, Agent, or Firm* — Oblon, McClelland, Maier & Neustadt, L.L.P.

(57) ABSTRACT

A superconducting coil according to an embodiment includes: a winding frame; a superconducting wire wound around the winding frame and having a first region and a second region facing the first region in a coil radial direction; and a resin layer located between the first region and the second region and including particles, an epoxy resin surrounding the particles, and a region existing between the particle and the epoxy resin, the region including silane containing a phenylamino group. The average particle diameter of the particles is equal to or more than 1 μm and equal to or less than 5 μm, and the volume ratio of the particles in the resin layer is equal to or more than 50% and equal to or less than 66%.

16 Claims, 6 Drawing Sheets

(56)     References Cited

FOREIGN PATENT DOCUMENTS

| | | | |
|---|---|---|---|
| JP | 2021-31547 | A | 3/2021 |
| JP | 2021-123647 | A | 8/2021 |
| JP | 2021-150391 | A | 9/2021 |

* cited by examiner

THIRD DIRECTION

C

100

10

12

CIRCUMFERENTIAL
DIRECTION OF COIL
(SECOND DIRECTION)

RADIAL
DIRECTION OF COIL
(FIRST DIRECTION)

THIRD DIRECTION

RADIAL DIRECTION OF COIL
(FIRST DIRECTION)

SUPERCONDUCTING COIL, SUPERCONDUCTING DEVICE, AND LIQUID EPOXY RESIN COMPOSITION

CROSS-REFERENCE TO RELATED APPLICATION

This application is based upon and claims the benefit of priority from Japanese Patent Application No. 2022-042166, filed on Mar. 17, 2022, the entire contents of which are incorporated herein by reference.

FIELD

Embodiments described herein relate generally to a superconducting coil, a superconducting device, and a liquid epoxy resin composition.

BACKGROUND

A nuclear magnetic resonance (NMR) or a magnetic resonance imaging system (MRI) uses, for example, a superconducting coil to generate a strong magnetic field. The superconducting coil is formed by winding a superconducting wire around a winding frame.

When a quench occurs in which a part of the superconducting wire loses superconductivity and transitions to a normal conducting state, a current flowing through the superconducting coil fluctuates, and a magnetic field generated by the superconducting coil becomes unstable, for example. In addition, it is likely that, for example, thermal runaway occurs in which a large amount of heat is instantaneously generated by Joule heat generated at a portion where the quench occurs. When thermal runaway occurs, the superconducting coil may burn out.

The quench is considered to occur due to a stress caused by a difference in thermal expansion coefficient between component materials during cooling of the superconducting coil or a stress caused by deformation of the coil by electromagnetic force. This stress causes cracks of an impregnated resin constituting the superconducting coil, separation between component materials, and movement of the coil, and generation of heat associated with these phenomena is considered to cause the quench.

DETAILED DESCRIPTION

Figure 1:
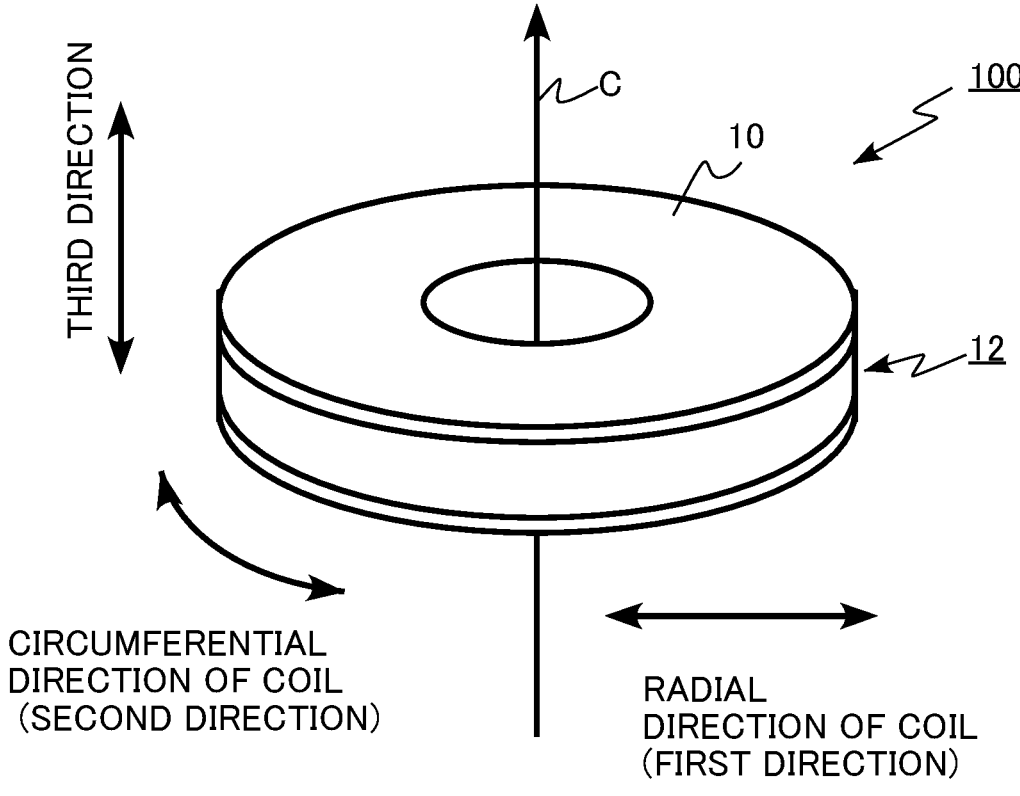
FIG. 1 is a schematic perspective view of a superconducting coil according to a first embodiment.

A superconducting coil according to the embodiments includes: a winding frame; a superconducting wire wound around the winding frame and having a first region and a second region facing the first region in a radial direction of the coil; and a resin layer located between the first region and the second region and including particles, an epoxy resin surrounding the particles, and a region existing between the particles and the epoxy resin, the region including silane containing a phenylamino group, wherein an average particle diameter of the particles is equal to or more than 1 μm and equal to or less than 5 μm, and a volume ratio of the particles in the resin layer is equal to or more than 50% and equal to or less than 66%.

Embodiments of the present disclosure will be described below with reference to the drawings. In the following description, the same or similar members and the like are denoted by the same reference numerals, and the description of the members and the like once described is omitted as appropriate.

First Embodiment

A superconducting coil according to the first embodiment includes: a winding frame; a superconducting wire wound around the winding frame and having a first region and a second region facing the first region in a radial direction of the coil; and a resin layer located between the first region and the second region and including particles, an epoxy resin surrounding the particles, and a region existing between the particles and the epoxy resin, the region including silane containing a phenylamino group. The average particle diameter of the particles is equal to or more than 1 μm and equal to or less than 5 μm, and the volume ratio of the particles in the resin layer is equal to or more than 50% and equal to or less than 66%.

Figure 2:
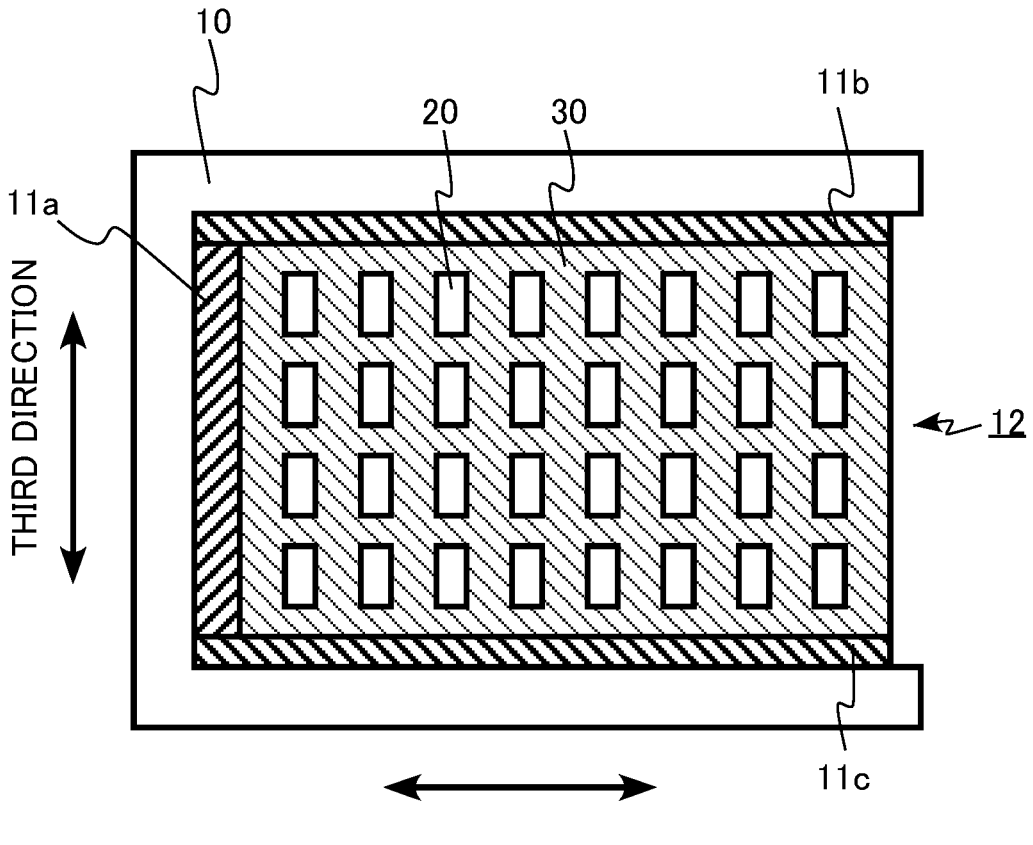
FIG. 2 is a schematic cross-sectional view of the superconducting coil according to the first embodiment.
Figure 3:
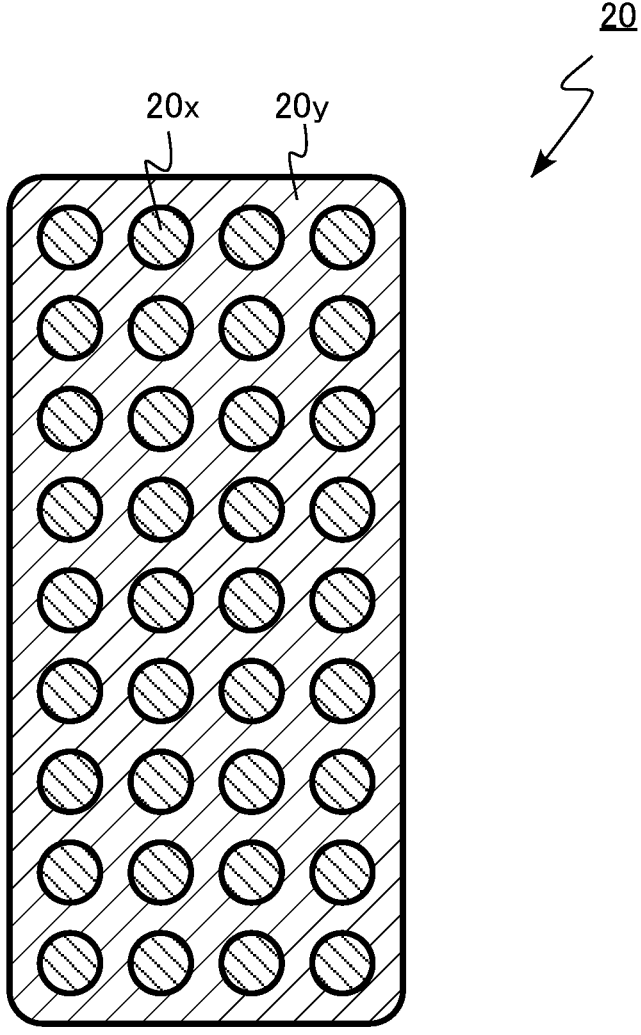
FIG. 3 is a schematic cross-sectional view of a superconducting wire according to the first embodiment.

FIG. 1 is a schematic perspective view of a superconducting coil according to the first embodiment. FIG. 2 is a schematic cross-sectional view of the superconducting coil according to the first embodiment. FIG. 3 is a schematic cross-sectional view of a superconducting wire according to the first embodiment.

A superconducting coil 100 according to the first embodiment is used, for example, as a coil for generating a magnetic field of a superconducting device such as a nuclear magnetic resonance, a magnetic resonance imaging system, a heavy ion radiotherapy device, or a superconducting maglev.

The superconducting coil 100 includes a winding frame 10, an inner peripheral insulating layer 11*a*, an upper insulating layer 11*b*, a lower insulating layer 11*c*, and a winding section 12. The winding section 12 includes a superconducting wire 20 and a resin layer 30.

The superconducting wire 20 is, for example, linear. The superconducting wire 20 is wound around the winding frame 10 around a winding center C as a solenoid. The radial direction of the coil is defined as a first direction, the circumferential direction of the coil is defined as a second direction, and the direction of the winding center C is defined as a third direction.

The resin layer 30 has a function of fixing the superconducting wire 20. The resin layer 30 has a function of preventing the superconducting wire 20 from being damaged by vibration or mutual friction during use of the superconducting device. The resin layer 30 also has a function of insulating adjacent portions of the superconducting wire 20 from each other.

The inner peripheral insulating layer 11*a*, the upper insulating layer 11*b*, and the lower insulating layer 11*c* are formed of, for example, fiber-reinforced plastic. The inner peripheral insulating layer 11*a*, the upper insulating layer 11b, and the lower insulating layer 11c have a function of insulating the winding section 12 from the winding frame 10 and the outside.

For the superconducting wire 20, a low-temperature superconductor having a critical temperature Tc of 8 K or more and 40 K or less is used, for example. The low-temperature superconductor used for the superconducting wire 20 is, for example, superconductor of a niobium-titanium alloy, a superconductor of a niobium-tin compound, a superconductor of a niobium-aluminum compound, or a superconductor of magnesium diboride.

FIG. 3 shows an example in which a superconductor of a niobium-titanium alloy is used for the superconducting wire 20. The superconducting wire 20 has a structure in which a plurality of niobium-titanium filaments 20x are disposed in a copper matrix 20y.

Figure 4:
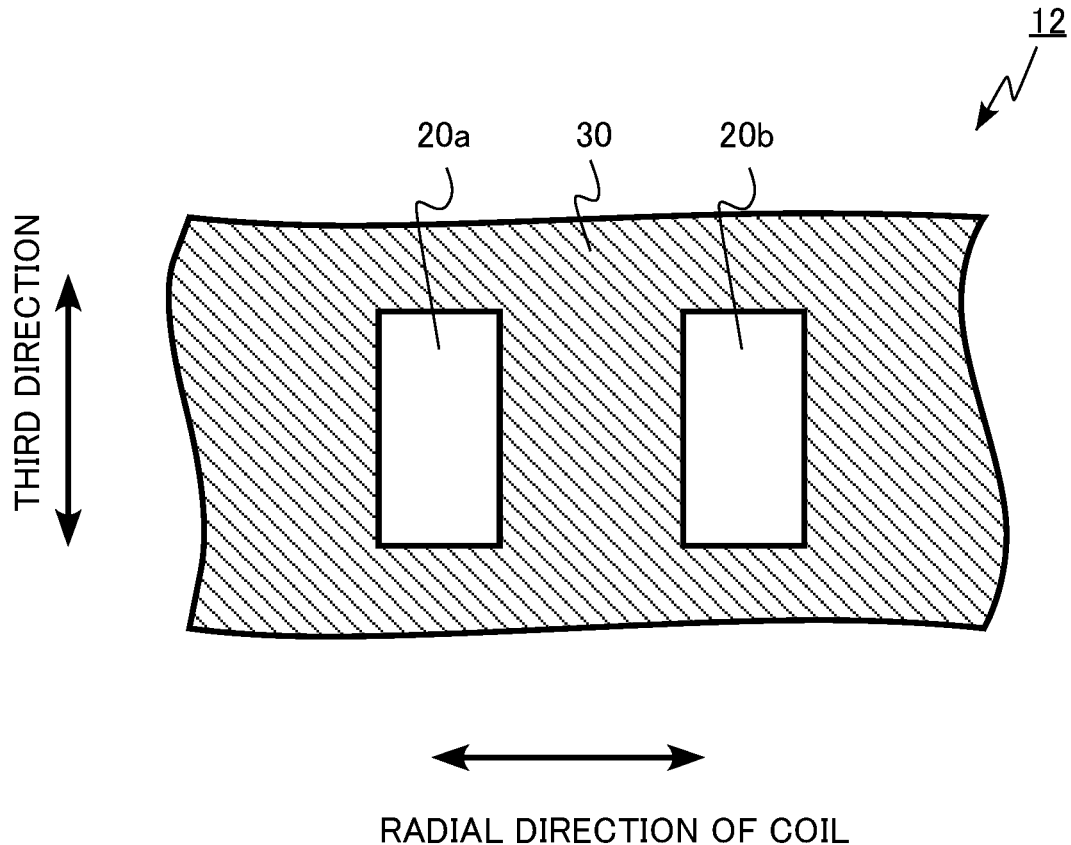
FIG. 4 is an enlarged schematic cross-sectional view of a winding section of the superconducting coil according to the first embodiment.

FIG. 4 is an enlarged schematic cross-sectional view of the winding section of the superconducting coil according to the first embodiment.

FIG. 4 illustrates a first region 20a and a second region 20b which are a part of the superconducting wire 20. The second region 20b faces the first region 20a in the radial direction of the coil. The second region 20b faces the first region 20a in the first direction. The resin layer 30 is present between the first region 20a and the second region 20b.

Figure 5:
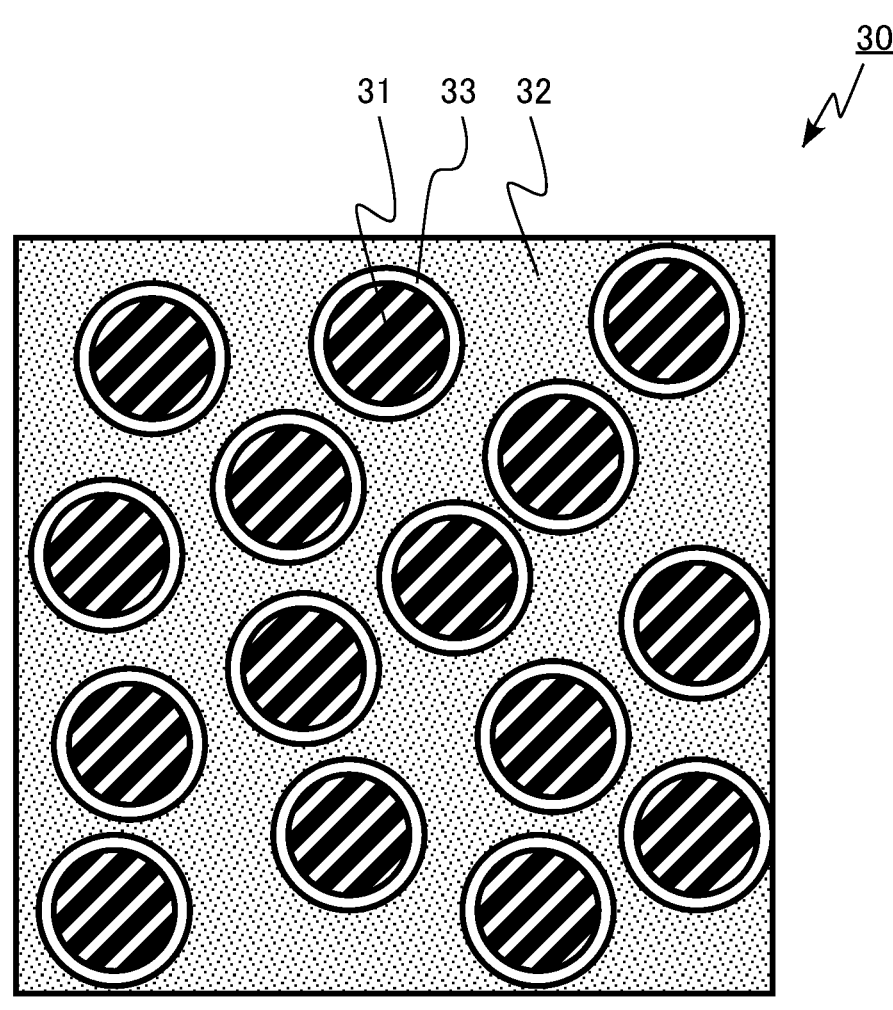
FIG. 5 is an enlarged schematic cross-sectional view of a resin layer of the superconducting coil according to the first embodiment.

FIG. 5 is an enlarged schematic cross-sectional view of the resin layer of the superconducting coil according to the first embodiment.

The resin layer 30 includes silica particles 31, an epoxy resin 32, and a coverage region 33. The silica particles 31 are an example of particles. The coverage region 33 is an example of a region.

The silica particles 31 are so-called fillers. The silica particles 31 have, for example, a spherical shape, a spheroidal shape, a cylindrical shape, or an indefinite shape, and are not particularly limited. FIG. 5 illustrates a case where the silica particles 31 have a spherical shape.

The average particle diameter of the silica particles 31 is equal to or more than 1 μm and equal to or less than 5 μm. The average particle diameter of the silica particles 31 can be determined from, for example, major diameters of the plurality of silica particles 31 which are measured using an image (SEM image) acquired by a scanning electron microscope (SEM).

The material of the silica particles 31 is, for example, fused silica or crystalline silica.

The volume ratio of the silica particles 31 in the resin layer 30 is equal to or more than 50% and equal to or less than 66%. The volume ratio of the silica particles 31 in the resin layer 30 is represented by, for example, the occupancy rate of the silica particles 31 in a cross section of the resin layer 30 obtained as an SEM image. The occupancy rate of the silica particles 31 can be obtained, for example, by image analysis of the SEM image.

The epoxy resin 32 surrounds the silica particles 31. The epoxy resin 32 is, for example, at least one resin selected from the group consisting of a bisphenol A type epoxy resin, a bisphenol F type epoxy resin, an alicyclic epoxy resin, and a novolac type epoxy resin.

The coverage region 33 is present between the silica particles 31 and the epoxy resin 32. The coverage region 33 surrounds, for example, the silica particles 31. The coverage region 33 is, for example, a monolayer.

The coverage region 33 is formed, for example, by surface treatment of the silica particles 31 using a silane coupling agent. The silane coupling agent used for the surface treatment of the silica particles 31 contains, for example, a phenylamino group. The silica particles 31 are, for example, particles surface-treated with a silane coupling agent containing a phenylamino group and an alkoxy group.

The coverage region 33 includes silane containing a phenylamino group. The coverage region 33 contains, for example, at least one compound selected from the group consisting of N-phenyl-3-aminopropyltrimethoxysilane, N-phenyl-3-aminopropyltriethoxysilane, N-phenyl-3-aminopropyldimethoxysilane, N-phenyl-3-aminopropyldiethoxysilane, N-phenyl-8-aminooctyltrimethoxysilane, N-phenyl-8-5 aminooctyltriethoxysilane, N-phenyl-8-aminooctyldimethoxysilane, and N-phenyl-8-aminooctyldiethoxysilane.

Whether or not the coverage region 33 contains silane containing a phenylamino group can be determined by, for example, pyrolysis-gas chromatography/mass spectrometry.

The coverage region 33 contains nitrogen. The nitrogen atom concentration of the coverage region 33 is higher than the nitrogen atom concentration of the epoxy resin 32, for example. The nitrogen atom concentration of the coverage region 33 is five times or more the nitrogen atom concentration of the epoxy resin 32, for example. The nitrogen contained in the coverage region 33 is derived from, for example, the silane coupling agent used for the surface treatment of the silica particles 31.

The magnitude relationship and the concentration difference between the nitrogen atom concentration of the coverage region 33 and the nitrogen atom concentration of the epoxy resin 32 can be determined by, for example, energy dispersive X-ray spectroscopy (EDX) using transmission electron microscopy (TEM).

The resin layer 30 has an absorption peak in a region of 580 nm or more and 630 nm or less in absorption spectrum measurement by ultraviolet visible absorption spectroscopy (UV-Vis). The absorption peak present in the region of 580 nm or more and 630 nm or less is considered to be derived from the phenylamino group contained in the coverage region 33.

Next, a method for manufacturing the superconducting coil 100 according to the first embodiment will be described.

First, the winding frame 10, the superconducting wire 20, and a two-liquid mixed epoxy resin composition are prepared. The two-liquid mixed epoxy resin composition includes a liquid A containing a liquid epoxy resin composition and a liquid B containing a curing agent.

The liquid epoxy resin composition according to the first embodiment contains a liquid epoxy resin base material and silica particles surface-treated with a silane coupling agent containing a phenylamino group. The average particle diameter of the silica particles contained in the liquid epoxy resin composition is equal or more than 1 μm and equal to or less than 5 μm, and the amount of the silica particles is equal to or more than 260 parts by weight and equal to or less than 520 parts by weight with respect to 100 parts by weight of the liquid epoxy resin base material.

For example, silica particles having an average particle diameter of 1 μm or more and 5 μm or less are subjected to a surface treatment in advance using a silane coupling agent containing a phenylamino group. The silane coupling agent is, for example, N-phenyl-3-aminopropyltrimethoxysilane.

Next, the surface-treated silica particles are mixed with the liquid epoxy resin base material. For example, the silica particles in an amount of 260 parts or more by weight and 520 parts or less by weight are mixed with respect to 100 parts by weight of the liquid epoxy resin base material. The liquid A containing the liquid epoxy resin composition is prepared by mixing the liquid epoxy resin base material and the silica particles.

Next, the superconducting wire 20 is wound around the winding frame 10. When the superconducting wire 20 is wound, the two-liquid mixed epoxy resin composition is applied between adjacent portions of the superconducting wire 20.

Before applying the two-liquid mixed epoxy resin composition, the liquid B containing the curing agent is added to the liquid A containing the liquid epoxy resin composition. The curing agent is, for example, an amine curing agent. For example, the curing agent in an amount of 30 parts or more by weight and 50 parts or less by weight are added to 100 parts by weight of the liquid epoxy resin base material. However, the amount of the amine curing agent to be added needs to be set such that the active hydrogen equivalent contained in the amine curing agent is in the range of 0.8 to 1.2 times the epoxy equivalent of the epoxy resin base material.

The maximum temperature of the liquid epoxy resin composition is maintained at 60° C. or less until the liquid epoxy resin composition is applied after the liquid epoxy resin composition is produced.

Thereafter, the two-liquid mixed liquid epoxy resin composition is cured, whereby the superconducting coil 100 is produced.

Note that, when the liquid epoxy resin composition is produced, it is also possible to simultaneously mix the silica particles and the silane coupling agent with the liquid epoxy resin and to treat the surfaces of the silica particles in the liquid epoxy resin.

The resin layer 30 may also be formed, for example, by a method for pouring the liquid epoxy resin composition and allowing infiltration of the liquid epoxy resin composition in a vacuum with the superconducting wire 20 being wound and fixed.

The functions and effects of the superconducting coil 100 according to the first embodiment will be described below.

While a superconducting device provided with the superconducting coil is used, a quench may occur in which a part of the superconducting wire loses superconductivity and transitions to a normal conducting state. In particular, a phenomenon called a training quench may occur in a superconducting coil using a low-temperature superconductor having a low critical temperature Tc for the superconducting wire 20 as in the first embodiment.

The training quench is an unstable phenomenon in which the quench occurs when the applied current value is lower than an allowable applied current value of the superconducting coil. It is required to suppress this unstable phenomenon and to enable a stable flow of a rated current through the superconducting coil. The operation of the superconducting coil is stabilized by enabling a stable flow of the rated current.

It is considered that the training quench occurs due to a stress caused by a difference in thermal expansion coefficient between component materials of the superconducting coil during cooling or a stress caused by deformation of the coil by electromagnetic force. This stress causes cracks of the resin constituting the superconducting coil, and heat generated due to the cracks is considered to cause the training quench.

One of the factors of the stress generated at the time of cooling the superconducting coil is a difference in thermal expansion coefficient between the superconducting wire and the resin layer. In the superconducting coil 100 according to the first embodiment, the resin layer 30 contains silica having a small thermal expansion coefficient as a filler in order to reduce a difference in thermal expansion coefficient between the superconducting wire 20 and the resin layer 30.

In the superconducting coil 100 according to the first embodiment, the volume ratio of the silica particles 31 in the resin layer 30 is equal to or more than 50% and equal to or less than 66%. Due to the volume ratio of the silica particles 31 being set to be equal to or more than 50% and equal to or less than 66%, the thermal expansion coefficient of the superconducting wire 20 and the thermal expansion coefficient of the resin layer 30 are substantially the same. Therefore, the stress generated at the time of cooling the superconducting coil 100 is reduced, and the occurrence of cracks in the resin is suppressed. Therefore, the occurrence of quench of the superconducting coil 100 is suppressed.

When the superconducting coil 100 according to the first embodiment is manufactured, a two-liquid mixed liquid epoxy resin composition for forming the resin layer 30 is prepared. The silica particles are mixed in an amount of 260 parts or more by weight and 520 parts or less by weight with respect to 100 parts by weight of the liquid epoxy resin. As a result, the volume ratio of the silica particles 31 in the resin layer 30 to be manufactured can be set to be equal to or more than 50% and equal to or less than 66%.

When the density of silica particles contained in the two-liquid mixed liquid epoxy resin composition forming the resin layer is increased during manufacture of the superconducting coil, the viscosity of the liquid epoxy resin composition is increased. In particular, when the average particle diameter of the silica particles decreases, the viscosity of the liquid epoxy resin composition further increases. When the viscosity of the liquid epoxy resin composition increases, for example, silica particles 31 are not uniformly dispersed in the liquid epoxy resin, which causes a problem.

When the liquid epoxy resin composition for forming the resin layer 30 of the superconducting coil 100 according to the first embodiment is produced, the silica particles are subjected to a surface treatment using a silane coupling agent containing a phenylamino group. Due to the surface treatment of the silica particles using the silane coupling agent containing a phenylamino group, the viscosity of the liquid epoxy resin composition is lowered. Therefore, the silica particles 31 can be uniformly dispersed in the liquid epoxy resin, for example.

It is considered that, due to the silane coupling agent containing a phenyl group, interaction with the phenyl group constituting the epoxy resin occurs, and compatibility between the liquid epoxy resin and the silica particles is improved.

The viscosity of the liquid epoxy resin composition decreases as the average particle diameter of the silica particles increases. Therefore, from the viewpoint of forming the resin layer 30, the average particle diameter of the silica particles is preferably large.

Studies by the inventors have revealed that there is a correlation between the risk of occurrence of quench of the superconducting coil and the particle diameter of the silica particles in the resin layer 30. That is, it has been found that the risk of occurrence of quench of the superconducting coil increases as the particle diameter of the silica particles increases. In particular, when the average particle diameter of the silica particles exceeds 5 μm, the risk of occurrence of quench of the superconducting coil increases.

It is considered that, when the particle diameter of the silica particles increases, the silica particles are likely to be separated from the epoxy resin. It is considered that, when the particle diameter of the silica particles increases, the surface area of the adhesion interface between the epoxy resin and the silica particles with respect to the volume of the silica particles, that is, the specific surface area decreases, and the silica particles are likely to be separated from the epoxy resin. It is considered that the risk of occurrence of quench of the superconducting coil increases as the silica particles are separated from the epoxy resin.

In the superconducting coil 100 according to the first embodiment, the average particle diameter of the silica particles 31 is equal to or less than 5 μm. Therefore, the risk of occurrence of quench of the superconducting coil 100 can be reduced. In other words, the occurrence of quench of the superconducting coil 100 is suppressed.

When the silica particles 31 are subjected to the surface treatment using a silane coupling agent containing a phenylamino group, the viscosity of the liquid epoxy resin composition can be kept low, even if, for example, the average particle diameter of the silica particles 31 is 1 μm and an amount of the silica particles 31 is 520 parts by weight.

From the viewpoint of reducing the risk of occurrence of quench of the superconducting coil 100, the average particle diameter of the silica particles 31 is preferably equal to or less than 4 μm, and more preferably equal or less than 3 μm.

From the viewpoint of reducing the viscosity of the liquid epoxy resin composition, the average particle diameter of the silica particles 31 is preferably equal to or more than 1.5 μm.

The liquid epoxy resin composition according to the first embodiment contains a liquid epoxy resin and silica particles subjected to a surface treatment using a silane coupling agent containing a phenylamino group. The liquid epoxy resin composition according to the first embodiment can maintain low viscosity in a temperature range of 60° C. or lower, because it contains silica particles surface-treated with a silane coupling agent containing a phenylamino group. Therefore, it is not necessary to set the temperature to be higher than 60° C. when the liquid epoxy resin composition is weighed or stirred.

For example, when the temperature of the liquid A containing the liquid epoxy resin composition is increased, the ring-opening of the epoxy group of the liquid epoxy resin is promoted before the liquid epoxy resin is applied. Therefore, when the liquid epoxy resin between adjacent portions of the superconducting wire 20 is solidified, the amino group of the amine curing agent to react with the epoxy base material may remain, and an uncured portion may be formed in the resin layer 30. When the uncured portion is formed in the resin layer 30, the movement of the wire cannot be restricted, and heat is generated by friction to increase the risk of the occurrence of quench.

The liquid A containing the liquid epoxy resin composition according to the first embodiment can keep low viscosity in a temperature range of 60° C. or lower. Therefore, the occurrence of quench of the superconducting coil 100 is suppressed by producing the superconducting coil 100 using the liquid epoxy resin composition according to the first embodiment.

In addition, the liquid epoxy resin composition according to the first embodiment can maintain low viscosity even at normal temperature. Therefore, it is easy to, for example, automate the mixing of the liquid epoxy resin composition and the curing agent and the application to the superconducting wire.

As described above, according to the first embodiment, the occurrence of cracks in the resin layer is suppressed. Therefore, a superconducting coil in which the occurrence of quench is suppressed can be achieved.

Second Embodiment

The second embodiment describes a superconducting device including the superconducting coil according to the first embodiment. The descriptions overlapping with those of the first embodiment will be partially omitted below.

Figure 6:
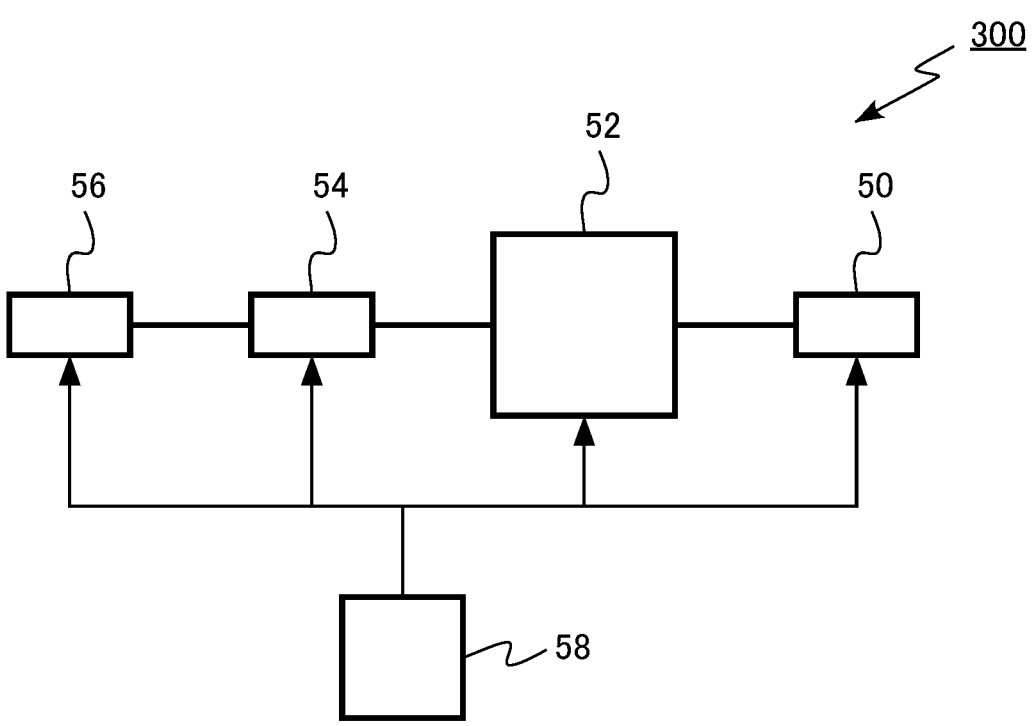
FIG. 6 is a block diagram of a superconducting device according to a second embodiment.

FIG. 6 is a block diagram of the superconducting device according to the second embodiment. The superconducting device according to the second embodiment is a heavy ion radiotherapy device 300. The heavy ion radiotherapy device 300 is an example of the superconducting device.

The heavy ion radiotherapy device 300 includes an incidence system 50, a synchrotron accelerator 52, a beam transport system 54, an irradiation system 56, and a control system 58.

The incidence system 50 has, for example, a function of generating carbon ions to be used for treatment and preliminarily accelerating the carbon ions to be incident on the synchrotron accelerator 52. The incidence system 50 includes, for example, an ion generation source and a linear accelerator.

The synchrotron accelerator 52 has a function of accelerating the carbon ion beam incident from the incidence system 50 to energy appropriate to treatment. The superconducting coil according to the first embodiment is used for the synchrotron accelerator 52.

The beam transport system 54 has a function of transporting the carbon ion beam incident from the synchrotron accelerator 52 to the irradiation system 56. The beam transport system 54 includes, for example, a bending electromagnet.

The irradiation system 56 has a function of irradiating a patient to be irradiated with the carbon ion beam incident from the beam transport system 54. The irradiation system 56 has, for example, a rotating gantry that enables irradiation of the carbon ion beam from any direction. The superconducting coil according to the first embodiment is used for the rotary gantry.

The control system 58 controls the incidence system 50, the synchrotron accelerator 52, the beam transport system 54, and the irradiation system 56. The control system 58 is, for example, a computer.

In the heavy ion radiotherapy device 300 according to the second embodiment, the superconducting coil according to the first embodiment is used for the synchrotron accelerator 52 and the rotating gantry. Therefore, the occurrence of quench is suppressed, and high reliability is achieved.

The second embodiment has described the heavy ion radiotherapy device 300 as an example of the superconducting device, but the superconducting device may be a nuclear magnetic resonance, a magnetic resonance imaging system, or a superconducting maglev.

In the first embodiment, a low-temperature superconductor is used for the superconducting wire 20. However, a high-temperature superconductor can also be used for the superconducting wire 20.

In the first embodiment, silica particles are used as an example of the particles contained in the resin layer 30. However, the particles contained in the resin layer 30 are not limited to silica particles. For example, alumina particles can be used as the particles contained in the resin layer 30.

While certain embodiments have been described, these embodiments have been presented by way of example only, and are not intended to limit the scope of the inventions. Indeed, the superconducting coil, the superconducting device, and the liquid epoxy resin composition described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A superconducting coil comprising:
a winding frame;
a superconducting wire wound around the winding frame and having a first region and a second region facing the first region in a radial direction of the coil; and
a resin layer located between the first region and the second region and including particles, an epoxy resin surrounding the particles, and a region existing between the particles and the epoxy resin, the region including silane containing a phenylamino group, wherein
an average particle diameter of the particles is equal to or more than 1 μm and equal to or less than 5 μm,
a volume ratio of the particles in the resin layer is equal to or more than 50% and equal to or less than 66%, and
the particles are silica particles.

2. The superconducting coil according to claim 1, wherein the region contains at least one compound selected from a group consisting of
N-phenyl-3-aminopropyltrimethoxysilane,
N-phenyl-3-aminopropyltriethoxysilane,
N-phenyl-3-aminopropyldimethoxysilane,
N-phenyl-3-aminopropyldiethoxysilane,
N-phenyl-8-aminooctyltrimethoxysilane,
N-phenyl-8-aminooctyltriethoxysilane,
N-phenyl-8-aminooctyldimethoxysilane, and
N-phenyl-8-aminooctyldiethoxysilane.

3. The superconducting coil according to claim 1, wherein the superconducting wire includes a superconductor of a niobium-titanium alloy, a superconductor of a niobium-tin compound, a superconductor of a niobium-aluminum compound, or a superconductor of magnesium diboride.

4. The superconducting coil according to claim 1, wherein the average particle diameter of the particles is less than 3 μm.

5. A superconducting device comprising the superconducting coil according to claim 1.

6. A superconducting coil comprising:
a winding frame;
a superconducting wire wound around the winding frame and having a first region and a second region facing the first region in a radial direction of the coil; and
a resin layer located between the first region and the second region and including particles, an epoxy resin surrounding the particles, and a region existing between the particles and the epoxy resin, wherein
an average particle diameter of the particles is equal to or more than 1 μm and equal to or less than 5 μm,
a volume ratio of the particles in the resin layer is equal to or more than 50% and equal to or less than 66%,
the region has a nitrogen atom concentration higher than a nitrogen atom concentration of the epoxy resin, and
the particles are silica particles.

7. The superconducting coil according to claim 6, wherein the nitrogen atom concentration in the region is equal to or more than five times the nitrogen atom concentration of the epoxy resin.

8. The superconducting coil according to claim 6, wherein the superconducting wire includes a superconductor of a niobium-titanium alloy, a superconductor of a niobium-tin compound, a superconductor of a niobium-aluminum compound, or a superconductor of magnesium diboride.

9. The superconducting coil according to claim 6, wherein the average particle diameter of the particles is less than 3 μm.

10. A superconducting coil comprising:
a winding frame;
a superconducting wire wound around the winding frame and having a first region and a second region facing the first region in a radial direction of the coil; and
a resin layer located between the first region and the second region and including particles and an epoxy resin surrounding the particles, the particles being surface-treated with a silane coupling agent containing a phenylamino group, wherein
an average particle diameter of the particles is equal to or more than 1 μm and equal to or less than 5 μm,
a volume ratio of the particles in the resin layer is equal to or more than 50% and equal to or less than 66%, and
the particles are silica particles.

11. The superconducting coil according to claim 10, wherein the silane coupling agent contains at least one compound selected from a group consisting of
N-phenyl-3-aminopropyltrimethoxysilane,
N-phenyl-3-aminopropyltriethoxysilane,
N-phenyl-3-aminopropyldimethoxysilane,
N-phenyl-3-aminopropyldiethoxysilane,
N-phenyl-8-aminooctyltrimethoxysilane,
N-phenyl-8-aminooctyltriethoxysilane,
N-phenyl-8-aminooctyldimethoxysilane, and
N-phenyl-8-aminooctyldiethoxysilane.

12. The superconducting coil according to claim 10, wherein the superconducting wire includes a superconductor of a niobium-titanium alloy, a superconductor of a niobium-tin compound, a superconductor of a niobium-aluminum compound, or a superconductor of magnesium diboride.

13. The superconducting coil according to claim 10, wherein the average particle diameter of the particles is less than 3 μm.

14. A superconducting coil comprising:
a winding frame;
a superconducting wire wound around the winding frame and having a first region and a second region facing the first region in a radial direction of the coil; and
a resin layer located between the first region and the second region and including particles and an epoxy resin surrounding the particles, wherein
an average particle diameter of the particles is equal to or more than 1 μm and equal to or less than 5 μm,
a volume ratio of the particles in the resin layer is equal to or more than 50% and equal to or less than 66%,
the resin layer has an absorption peak in a region of 580 nm or more and 630 nm or less in absorption spectrophotometry by ultraviolet-visible spectroscopy, and
the particles are silica particles.

15. The superconducting coil according to claim 14, wherein the superconducting wire includes a superconductor of a niobium-titanium alloy, a superconductor of a niobium-tin compound, a superconductor of a niobium-aluminum compound, or a superconductor of magnesium diboride.

16. The superconducting coil according to claim 14, wherein the average particle diameter of the particles is less than 3 μm.

* * * * *